(12) United States Patent
Woo et al.

(10) Patent No.: US 6,555,461 B1
(45) Date of Patent: Apr. 29, 2003

(54) METHOD OF FORMING LOW RESISTANCE BARRIER ON LOW K INTERCONNECT

(75) Inventors: Christy Mei-Chu Woo, Cupertino, CA (US); Suzette K. Pangrle, Cupertino, CA (US); Minh Van Ngo, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/884,059

(22) Filed: Jun. 20, 2001

(51) Int. Cl.[7] .......................................... H01L 21/4763
(52) U.S. Cl. ...................... 438/622; 438/682; 438/687; 438/698; 438/723; 438/740
(58) Field of Search ........................... 438/627, 643, 438/648, 682, 687, 698, 723, 740, 743, 785

(56) References Cited

U.S. PATENT DOCUMENTS

| | | | |
|---|---|---|---|
| 5,985,762 A | | 11/1999 | Geffken et al. |
| 6,150,723 A | | 11/2000 | Harper et al. |
| 6,251,796 B1 | * | 6/2001 | Abdul-Ridha et al. ........ 216/76 |
| 6,303,490 B1 | * | 10/2001 | Jeng ............................ 438/627 |
| 6,342,448 B1 | * | 1/2002 | Lin et al. ..................... 438/595 |

* cited by examiner

*Primary Examiner*—David Nelms
*Assistant Examiner*—Mai-Huong Tran

(57) ABSTRACT

A method for forming a metal interconnect structure provides a conformal layer of barrier material, such as a nitride, within a patterned opening in a dielectric layer. The barrier material is deposited after the opening is etched to the dielectric layer, stopping on a diffusion barrier. A first layer of a metal barrier material, such as tantalum, is conformally deposited on the barrier material. A directional etch is performed that removes horizontal nitride and tantalum, leaving the nitride and tantalum on the sidewalls of the patterned opening. The barrier material prevents contamination of the dielectric layer from conductive material, such as copper, during the etching of the diffusion barrier overlying the conductive material, and during subsequent sputter etch cleaning. A thin, second metal layer is conformally deposited and forms a suitable barrier on the sidewalls of the opening, while providing low contact resistance between the second metal layer and the underlying substrate.

11 Claims, 10 Drawing Sheets

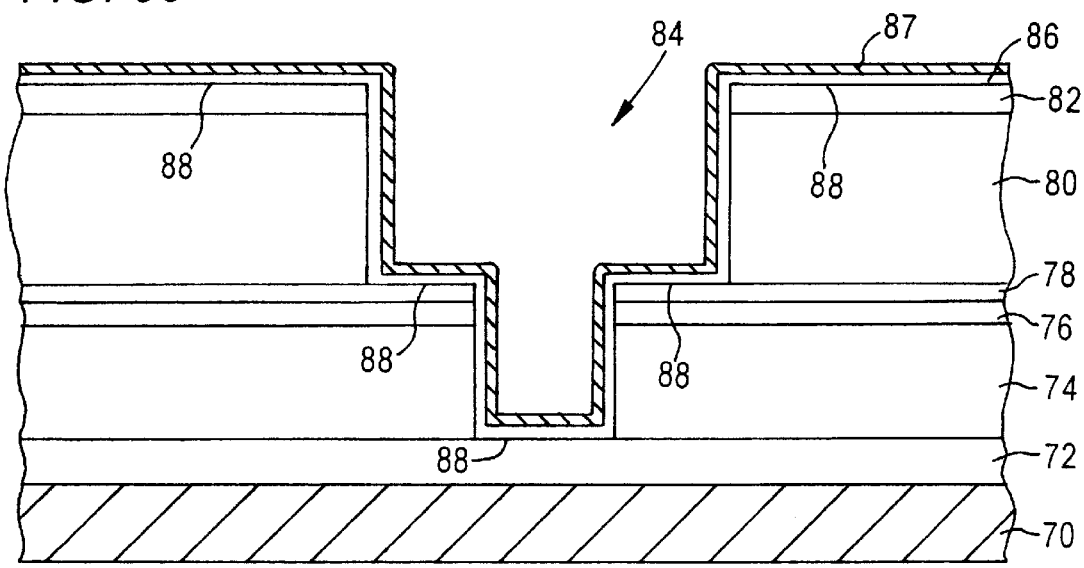
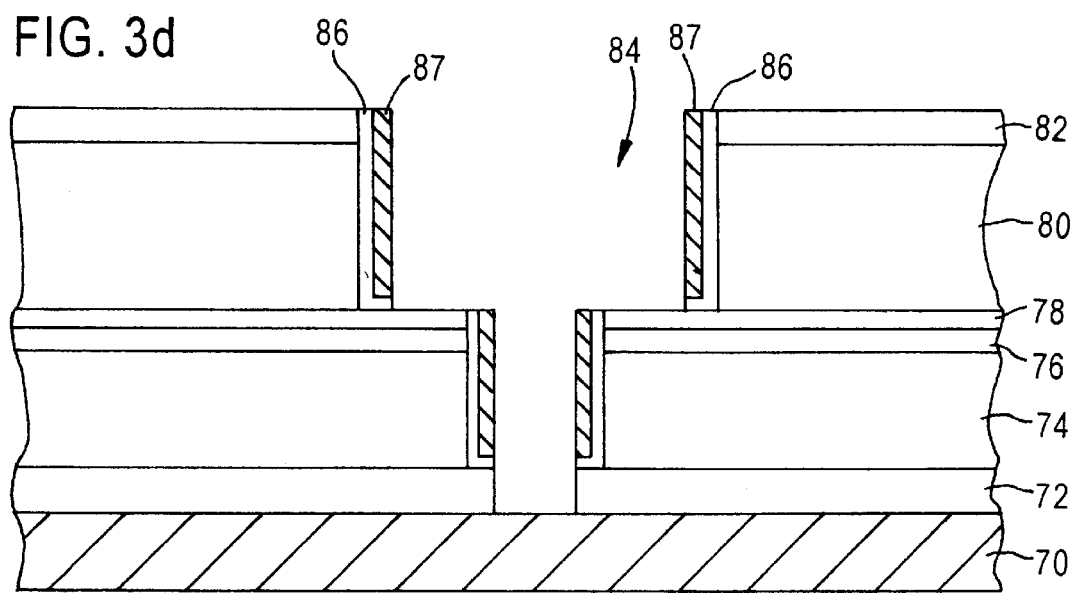

METHOD OF FORMING LOW RESISTANCE BARRIER ON LOW K INTERCONNECT

FIELD OF THE INVENTION

The present invention relates to the manufacturing of semiconductor devices, and more particularly, to copper and copper alloy metallization in semiconductor devices.

BACKGROUND OF THE INVENTION

The escalating requirements for high density and performance associated with ultra large scale integration (ULSI) semiconductor device wiring are difficult to satisfy in terms of providing sub-micron-sized, low resistance-capacitance (RC) metallization patterns. This is particularly applicable when the sub-micron-features, such as vias, contact areas, lines, trenches, and other shaped openings or recesses have high aspect ratios (depth-to-width) due to miniaturization.

Conventional semiconductor devices typically comprise a semiconductor substrate, usually of doped monocrystalline silicon (Si), and a plurality of sequentially formed dielectric interlayer dielectrics and electrically conductive patterns. An integrated circuit is formed therefrom containing a plurality of patterns of conductive lines separated by inter wiring spacings, and a plurality of interconnect lines, such as bus lines, bit lines, word lines and logic interconnect lines. Typically, the conductive patterns of vertically spaced metallization layers are electrically interconnected by vertically oriented conductive plugs filling via holes formed in the interlayer dielectric layer separating the metallization layers, while other conductive plugs filling contact holes establish electrical contact with active device regions, such as a source/drain region of a transistor, formed in or on a semiconductor substrate. Conductive lines formed in trench-like openings typically extend substantially parallel to the semiconductor substrate. Semiconductor devices of such type according to current technology may comprise five or more levels of metallization to satisfy device geometry and micro miniaturization requirements.

A commonly employed method for forming conductive plugs for electrically interconnecting vertically spaced metallization layers is known as "damascene"-type processing. Generally, this process involves forming an opening (or via) in the dielectric interlayer, which will subsequently separate the vertically spaced metallization layers. The via is typically formed using conventional lithographic and etching techniques. After the via is formed, the via is filled with a conductive material, such as tungsten (W), using conventional techniques. Excess conductive material on the surface of the dielectric interlayer is then typically removed by chemical mechanical planarization (CMP).

A variant of the above-described process, termed "dual damascene" processing, involves the formation of an opening having a lower contact (or via) hole section which communicates with an upper trench section. The opening is then filled with a conductive material to form a conductive plug that electrically contacts the lower metallization layer. As with the previous process, excess conductive material on the surface of the dielectric interlayer is then removed by CMP. An advantage of the dual damascene process is that the conductive plug and the upper metallization layer are formed simultaneously.

High performance microprocessor applications require rapid speed of semiconductor circuitry, and the integrated circuit speed varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. If the interconnection node is routed over a considerable distance, e.g., hundreds of microns or more, as in submicron technologies, the interconnection capacitance limits the circuit node capacitance loading and, hence, the circuit speed. As integration density increases and feature size decreases, in accordance with submicron design rules, the rejection rate due to integrated circuit speed delays significantly reduces manufacturing throughput and increases manufacturing costs.

One way to increase the circuit speed is to reduce the resistance of a conductive pattern. Conventional metallization patterns are typically formed by depositing a layer of conductive material, notably aluminum (Al) or an alloy thereof, and etching, or by damascene techniques. Al is conventionally employed because it is relatively inexpensive, exhibits low resistively and is relatively easy to etch. However, as the size of openings for vias/contacts and trenches is scaled down to the sub-micron range, step coverage problems result from the use of Al. Poor step coverage causes high current density and enhanced electromigration. Moreover, low dielectric constant polyamide materials, when employed as dielectric interlayers, create moisture/bias reliability problems when in contact with Al, and these problems have decreased the reliability of interconnections formed between various metallization layers.

One approach to improved interconnection paths in vias involves the use of completely filled plugs of a metal, such as W. Accordingly, many current semiconductor devices utilizing VLSI (very large scale integration) technology employ Al for the metallization layer and W plugs for interconnections between the different metallization levels. The use of W, however, is attendant with several disadvantages. For example, most W processes are complex and expensive. Furthermore, W has a high resistivity, which decreases circuit speed. Moreover, Joule heating may enhance electromigration of adjacent Al wiring. Still a further problem is that W plugs are susceptible to void formation, and the interface with the metallization layer usually results in high contact resistance.

Another attempted solution for the Al plug interconnect problem involves depositing Al using chemical vapor deposition (CVD) or physical vapor deposition (PVD) at elevated temperatures. The use of CVD for depositing Al is expensive, and hot PVD Al deposition requires very high process temperatures incompatible with manufacturing integrated circuitry.

Copper (Cu) and Cu-based alloys are particularly attractive for use in VLSI and ULSI semiconductor devices, which require multi-level metallization layers. Cu and Cu-based alloy metallization systems have very low resistivities, which are significantly lower than W and even lower than those of previously preferred systems utilizing Al and its alloys. Additionally, Cu has a higher resistance to electromigration. Furthermore, Cu and its alloys enjoy a considerable cost advantage over a number of other conductive materials, notably silver (Ag) and gold (Au). Also, in contrast to Al and refractory-type metals (e.g., titanium (Ti), tantalum (Ta) and (W), Cu and its alloys can be readily deposited at low temperatures formed by well-known "wet" plating techniques, such as electroless and electroplating techniques, at deposition rates fully compatible with the requirements of manufacturing throughput.

A problem that can be caused by the use of copper and copper-based alloys results from copper having a relatively large diffusion coefficient into dielectric materials, such as low k dielectric materials. Once copper is diffused into these materials, copper can cause the dielectric strength of these materials to decrease. Thus, if copper from a plug or metallization layer diffuses into the dielectric layer, the layer can become more conductive and the increase in conductivity can cause short circuits between adjacent conductive regions. These short circuits can therefore result in failure of the semiconductor device. For this reason, copper conductors are encapsulated by at least one diffusion barrier to prevent diffusion of the copper into the dielectric layer. However, the use of conventional barrier and adhesion layers within the opening, such as a TiN or TaN layer, may undesirably result in an increase in the contact resistance.

Even with the encapsulation of a copper conductor by a diffusion barrier layer, copper contamination of the dielectric layer can still result during the formation of an opening in the dielectric layer and etching of the diffusion barrier. As depicted in FIG. 4, which shows a prior art damascene opening, a copper material is provided in substrate layer (a metallization layer) 100. The interconnect structure includes a barrier diffusion layer 102 (such as silicon nitride), a dielectric layer 104 and a capping layer 106. During an initial etching step, an etchant is applied to etch through the cap layer 106 and the dielectric layer 104. The etching stops at the diffusion barrier 102. The complete opening 108 is formed by etching of the diffusion barrier 102. However, during the etching of the diffusion barrier 102 within the pattern opening 108, some of the copper from the underlying substrate 100 sputters up from the substrate layer 100 into the dielectric layer 104. The copper, represented as particles 110, enters through the sidewalls 112 of the opening 108.

Copper contamination can also occur as a result of the use of reverse physical sputtering to lean the first metallization layer 100 and to round the corners of trenches and vias. Reverse physical sputtering is a process by which atoms or molecules from the surface of a material are dislocated or removed by the impact energy of gas ions, which are accelerated in an electric field. This process involves the creation of a glow discharge or plasma between an anode and a cathode, such as a semiconductor device, wherein the current therebetween is composed of electron flow to the anode and positive ion flow to the cathode. The ions are created by the ionization of gas molecules, such as argon, existing within the flow discharge region between the anode and cathode. The ionization results from the collision of gas particles with the electron flow from the cathode to the anode. A focused beam of these ions can be directed to a very small point on a semiconductor device and then scanned, raster fashion, over a surface where material is to be removed. As an ion impinges on the semiconductor device surface, momentum is transferred from the ion to the impact surface resulting in the removal of one or more surface atoms.

There is a need for a method of forming a metal interconnect structure that substantially prevents copper contamination in the dielectric layer, caused by etching of the diffusion barrier or reverse sputtering to clean the first metallization layer, or similar processes, in which conductive material may be dislodged and diffused into a dielectric layer. Also, there is a need for a method of providing a barrier within an opening that provides adhesion for a seed layer, but has a low resistance.

SUMMARY OF THE INVENTION

These and other needs are met by embodiments of the present invention which provide a method of forming an interconnect structure comprising the steps of etching through a dielectric layer to a diffusion barrier to create an opening with a bottom and sidewalls. A nitride barrier layer is conformally deposited on the bottom and sidewalls of the opening. This is followed by conformally depositing a first metal layer on the nitride barrier layer. The nitride barrier layer and the first metal layer are directionally etched to remove the diffusion barrier, the nitride barrier layer and the first metal layer from the bottom of the opening, while maintaining the nitride barrier layer and the first metal layer on the sidewalls of the opening. The nitride barrier layer and the first metal layer substantially prevent scattering and diffusion of conductive material underlying the diffusion barrier into the dielectric layer. A second metal layer is conformally deposited in the opening, with a copper seed layer being deposited over the second metal layer. Copper or a copper-based alloy is electroplated in the opening.

In certain embodiments of the present invention, the first and second metal is tantalum, and the second metal layer is between about 25 Å and about 100 Å. The conformal deposition of the nitride barrier layer and the tantalum on the sidewalls of the opening acts as a passivation layer that prevents the conductive material, such as copper, from diffusing into the dielectric layer during the etching of the diffusion barrier or sputter cleaning of the conductive material. The thin second metal layer of tantalum provides adhesion for the copper seed layer, but has a very low contact resistance due to the thinness of the layer. In certain embodiments, the nitride barrier layer and the first metal (e.g. tantalum) layer are deposited without air break. In certain embodiments, the second metal (e.g. tantalum) layer and the copper seed layer are also deposited without air break.

By forming a conformal layer of barrier material on the sidewalls of the opening, and directionally etching the barrier material to remove the diffusion barrier as well as the barrier material from the bottom of the opening, a sufficient amount of barrier material remains on the sidewalls to prevent the scattering and diffusion of the conductive material, such as copper, into the dielectric layer. This controllably prevents the detrimental effects of copper diffusion into the dielectric layer and potential failure of the semiconductor device.

The earlier stated needs are also met by embodiments of the present invention which provide a metal interconnect structure comprising a substrate containing copper or copper-based alloy, a dielectric layer on the substrate, and an opening in the dielectric layer, this opening have sidewalls and a bottom that is formed by the substrate. A nitride layer is provided substantially only on the sidewalls. A first metal layer is substantially only on the nitride layer. A second metal layer is on the first metal layer and on the bottom of the opening. A copper seed layer is on the second metal layer and electroplated copper, or a copper-based alloy, is on the copper seed layer.

The earlier stated needs are also met by embodiments of the present invention which provide a method of forming a copper interconnect structure comprising the steps of forming an opening in a low k dielectric layer, this opening being bounded by sidewalls of the dielectric layer and a diffusion barrier underlying the dielectric layer and forming a horizontal surface. Nitride and a first tantalum layer are conformally deposited within the opening such that the diffusion barrier is covered with a horizontal layers of nitride and tantalum and the sidewalls are covered with vertical layers of nitride and tantalum. Directional etching is performed to remove the horizontal layers of nitride and tantalum, as well as the diffusion barrier at the bottom of the opening. A second layer of tantalum is conformally deposited in the opening. A copper seed layer is deposited on the second layer of tantalum. Copper or a copper-based alloy is electroplated in the opening.

The foregoing and other features, aspects and advantages of the present invention will become more apparent from the following detailed description of the present invention when taken in conjunction with the accompanying drawings.

BRIEF DESCRIPTION OF DRAWINGS

FIGS. 3a–3g depict certain steps in a process for forming a metal interconnect structure by a dual damascene technique in accordance with embodiments of the present invention.

DETAILED DESCRIPTION OF THE INVENTION

The present invention addresses problems related to the contamination of copper in a dielectric layer during the formation of a metal interconnect structure, and to the contact resistance of metal barrier/adhesion layers within a contact opening. The problems are solved, in part, by the present invention which provides, in certain embodiments, a conformal barrier within a patterned opening of a dielectric layer. The conformal barrier, which may be a layered nitride and tantalum, is deposited within the pattern opening prior to the etching of a diffusion barrier that is between the dielectric layer and an underlying metallization layer that is protected by the diffusion barrier. A directional etching is performed that removes the horizontal layers of conformal barrier material, as well as the diffusion barrier within the patterned opening overlying the first metallization layer. The directional etching, however, leaves the conformal barrier material on the sidewalls of the pattern opening. The barrier material on the sidewalls of the dielectric layer prevent copper atoms sputtered during the etching of the diffusion barrier from entering the dielectric layer through the sidewalls. Hence, copper contamination of the dielectric layer caused during the etching of the diffusion barrier, or even in subsequent reverse sputtering to clean the metallization layer, is largely prevented. A second metal layer, such as tantalum, is then deposited in a thin layer in the opening. The second metal layer provides a low resistance barrier layer and adhesion for a subsequently deposited copper seed layer. The thinness of the second metal layer keeps low the contact resistance between the second metal and the copper in the underlying conductive layer.

Figure 1A:
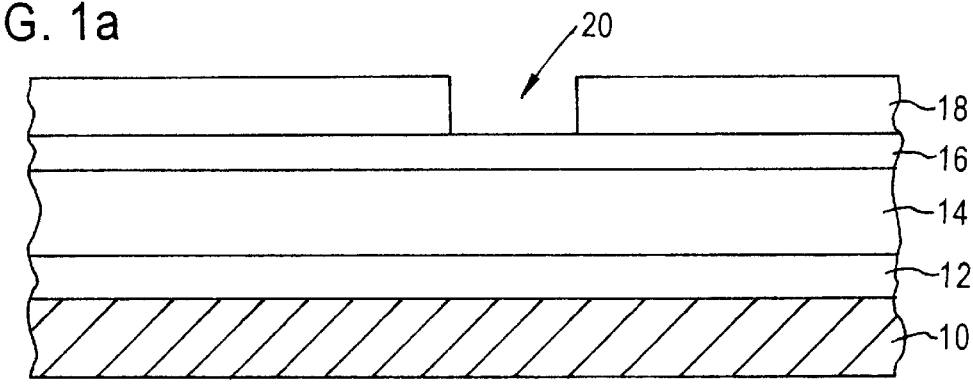
FIGS. 1a–1i depict the formation of a metal interconnect structure in accordance with an embodiment of the present invention employing a single damascene technique.

FIGS. 1a–1i depict the cross-section of a portion of a metal interconnect structure during sequential processing steps in accordance with embodiments of the present invention. In FIG. 1a, a conductive layer 10, or first metallization layer, is covered by a diffusion barrier 12. The conductive layer 10 may be a first metallization layer containing a conductive material, such as a copper line or other feature made of a conductive material. In certain preferred embodiments of the present invention, the conductive material is copper or a copper alloy, for obtaining the advantages known to those of ordinary skill in the art regarding the use of copper as a conductive material. A diffusion barrier 12 is provided to prevent the diffusion of conductive material, such as copper, from the conductive layer 10 into a dielectric layer 14 immediately above the diffusion barrier 12. The diffusion barrier may be made of a number of different materials, such as silicon nitride (SiN), silicon carbide (SiC), SiCN, etc. The diffusion barrier 12 may have a conventional thickness sufficient to serve as an etch stop layer to protect the conductive layer 10 during the etching of the overlying dielectric material, and prevent the diffusion of the conductive material into the dielectric layer 14.

A dielectric layer 14 is formed on diffusion barrier 12 in a conventional manner. Dielectric layer 14 may be made of a number of different materials, such as silicon oxide or low k dielectric materials, either inorganic or organic materials. Examples of low k dielectric materials include hydrogen silsesquioxane (HSQ), methyl silsesquioxane (MSQ), benzocyclobutene (BCB), Flare, SiLK, etc. In certain preferred embodiments of the invention, the dielectric material of the dielectric layer 14 is a low k dielectric material to achieve the lower dielectric constant provided by such materials.

A cap layer 16 is provided on the dielectric layer 14. The cap layer 16 may be made of silicon nitride or silicon oxynitride, for example. Other suitable cap materials include oxides, such as silicon oxide.

A mask layer 18 is formed and patterned on the cap layer 16. A mask opening 20 is formed in the mask layer 18 by conventional lithographic and mask formation techniques. The opening 20 will be transferred (etched) into the dielectric layer 14 in the shape of the desired opening for the dielectric layer 14.

Figure 1B:
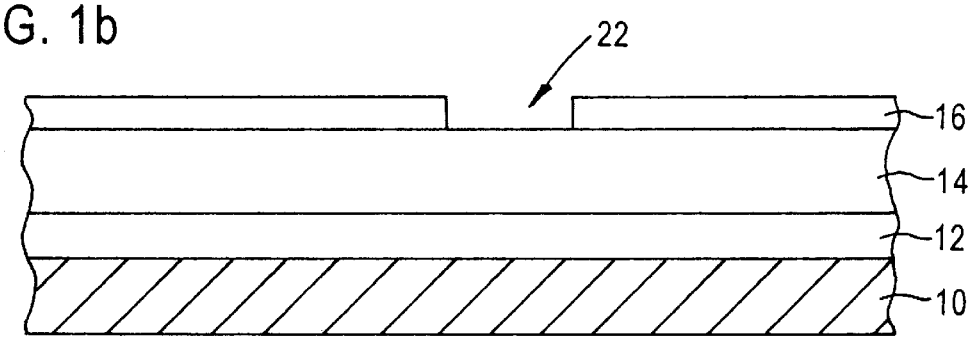

FIG. 1b depicts the metal interconnect structure of FIG. 1a following the etching of the cap layer 16 in accordance with the mask opening 20 in the mask layer 18. This creates an opening 22 in the cap layer 16. The mask layer 18 is removed at this time so that the sidewalls of the subsequently formed opening in the dielectric layer 14 will not be damaged by the mask removal processes, which may damage low k dielectric materials.

Figure 1C:
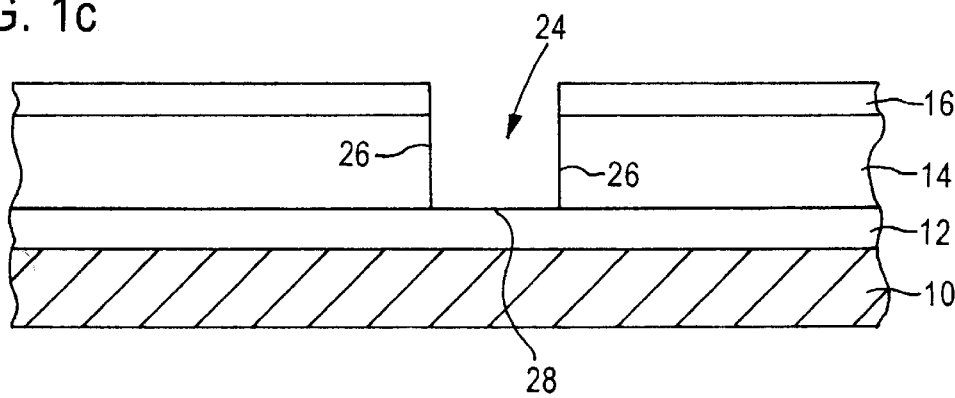

The dielectric layer 14 is then etched anisotropically, by a reactive ion etching, e.g., in accordance with the opening 22 in the cap layer 16. The results of this etching are depicted in FIG. 1c. The etching stops at the diffusion barrier 12, which now protects the conductive material, such as copper, in the underlying substrate 10. The pattern opening 24 now formed in the dielectric layer 14 has sidewalls 26 and a bottom surface 28. Conventional etch techniques and processes may be used to etch the dielectric layer 14 and stop on the diffusion barrier 12.

Figure 1D:
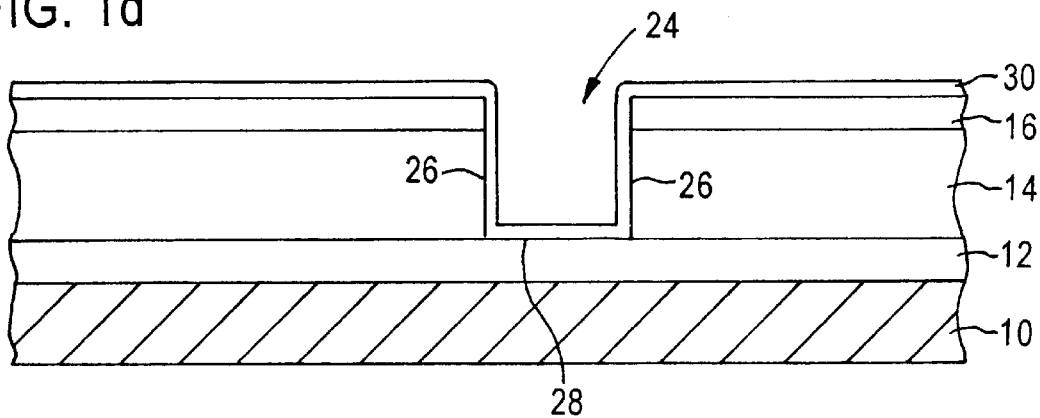

In FIG. 1d, a conformal layer of barrier material 30 is deposited over the cap layer 16 and in the pattern opening 24. An exemplary material for use as the barrier material 30 is nitride, for example. Conventional techniques for depositing a conformal layer may be employed, in certain embodiments of the present invention. For example, the conformal barrier material 30 may be deposited by plasma enhanced chemical vapor deposition (PECVD) or atomic layer chemical vapor deposition (ALCVD). It is desirable to provide a thin, conformal layer of the barrier material 30 so that subsequent etching will remove horizontal layers of the barrier material 30 while maintaining barrier material on vertical surfaces. An exemplary thickness of the layer of barrier material 30 is between about 25 Å and about 100 Å.

An exemplary process for depositing the conformal nitride in accordance with an embodiment of the present invention employs PECVD technology. Process parameters include providing $SiH_4$ at 230 sccm±30%, $NH_3$ at 44 sccm±30% and $N_2$ at 5700 sccm±30%. Pressure is maintained in the deposition chamber at 4.4 torr, ±10%. Power is at 430 W±20% and the spacing is at 600 mils±15%.

The above exemplary parameters of the present invention provide a conformal layer (film) of barrier material 30 that has a step coverage of about 85%, with a deposition rate of about 40 to 44 Å/sec, and a within wafer uniformity less than 0.7%. The reference index (RI) is 2.0±0.05.

Figure 1E:
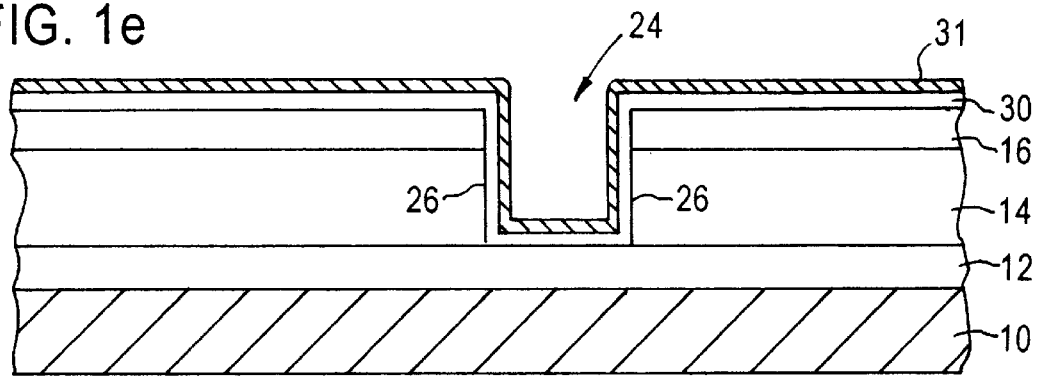

In FIG. 1e, a first metal layer 31 is conformally deposited over the barrier material 30. The first metal layer 31 may be made of tantalum, for example. A conventional physical vapor deposition (PVD) process may be employed to form the first metal layer 31. However, this process is advantageously performed without an air break after the deposition of the barrier material 30. Deposition of the tantalum without air break prevents undesirable oxide growth on the barrier material 30 prior to the deposition of the first metal layer 31. This produces alpha phase Ta as the first metal layer 31. If an air break occurs before the deposition of the first metal layer 31, then the barrier material (e.g., SiN) may be covered with a thin native oxide. This undesirably causes beta phase Ta, a higher resistance phase, to form as the first metal layer 31. An exemplary thickness of the first metal layer 31 is between about 50 Å A and about 150 Å.

Although tantalum is described as an exemplary embodiment, different materials may be used as the first metal layer 31. Such other materials include TaN, a TaN—Ta bilayer, TaSiN, TaSi, CVD TiN, CVD TiSiN, CVD TiN(Si) that is CVD TiN flash with Si on the top layer. Further materials include CVD WN, TaC, or other barrier/adhesion materials known to those of skill in the art.

Figure 1F:
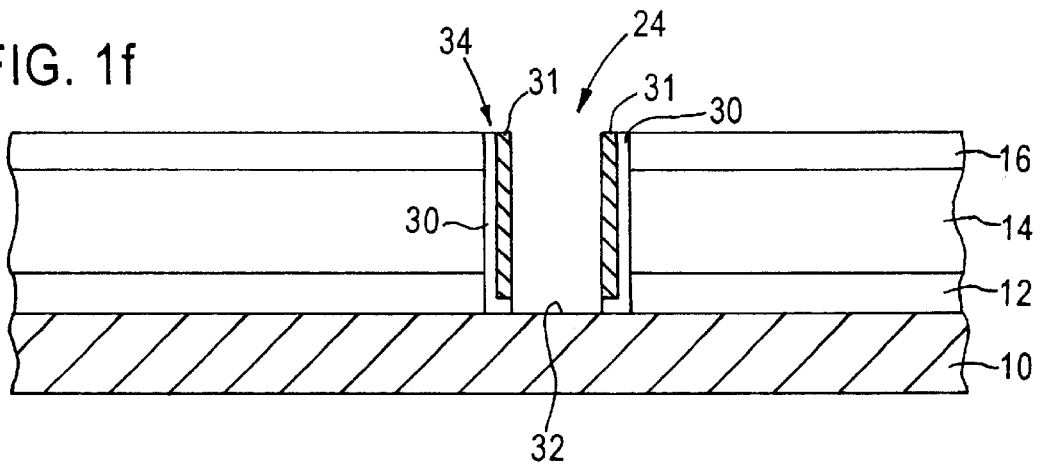

In FIG. 1f, a conventional directional etching is performed that removes the barrier material 30 and the first metal layer 31 from horizontal surfaces, such as the top of the cap layer 16 and from the surface 28 of the diffusion barrier 12. For the example of Ta, the etchant can be $Cl_2$ and $CHF_3$. The etching leaves barrier material 30 and first metal (e.g., tantalum) on the sidewalls 26 of the dielectric layer 14. The barrier material 30, the first metal layer 31 and the diffusion barrier 12 are completely removed from certain portions of the opening 24. This exposes the top surface 32 of the substrate 10. However, the etching of the diffusion barrier 12 and the subsequent potential sputtering of conductive material from the underlying substrate 10, do not create contamination in the dielectric layer 14. The barrier material 30 and the first metal layer 31 on the sidewalls 26 of the dielectric layer 14 act as a passivation layer to prevent the underlying conductive material from contaminating the dielectric layer 14.

The directional etching performed in FIG. 1f removes the horizontal nitride and first metal (hereinafter assumed to be tantalum for purposes of discussion), while leaving the vertical nitride of the barrier material 30 and the vertical tantalum of the first metal layer 31. Some of the vertical nitride and tantalum may be removed, as indicated at 34 in FIG. 1f, especially at the top of the pattern opening 24. However, the removal of a portion of the barrier material 30 and the tantalum 31 at the top of the pattern opening 24 presents little opportunity for copper contamination in the dielectric layer 14 as most of the potential contamination occurs at the bottom of the opening 24 in the dielectric layer 14.

Figure 1G:
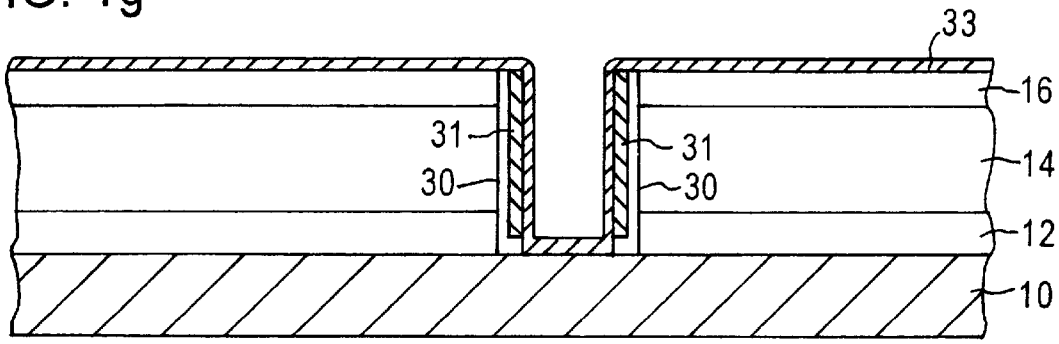

In FIG. 1g, a second metal layer 33 is conformally deposited, by PVD, for example. In certain preferred embodiments of the invention, the second metal layer 33 is made of the same material as the first metal layer. Hence, an exemplary material for the second metal layer 33 is tantalum. When tantalum is employed as the metal in the first and second metal layers 31, 33, the tantalum should be deposited as low resistance alpha phase tantalum. The second metal layer 33 will be alpha phase tantalum since it nucleates on the alpha phase tantalum of the first metal layer 31.

Although tantalum is also described as the material in the second metal layer 33, this is exemplary only as other materials may be employed in other embodiments of the invention, as discussed above with the first metal layer 31. The choice of the material in the second metal layer 33 may be made in dependence on the material in the first metal layer 31 to assure compatibility of the two layers 31, 33.

An exemplary thickness of the second metal layer 33 is between about 25 Å and about 100 Å. The thinness of the second metal layer 33 causes there to be a very low contact resistance between the second metal layer 33 and the metal (e.g., Cu) in the underlying substrate 10.

Figure 1H:
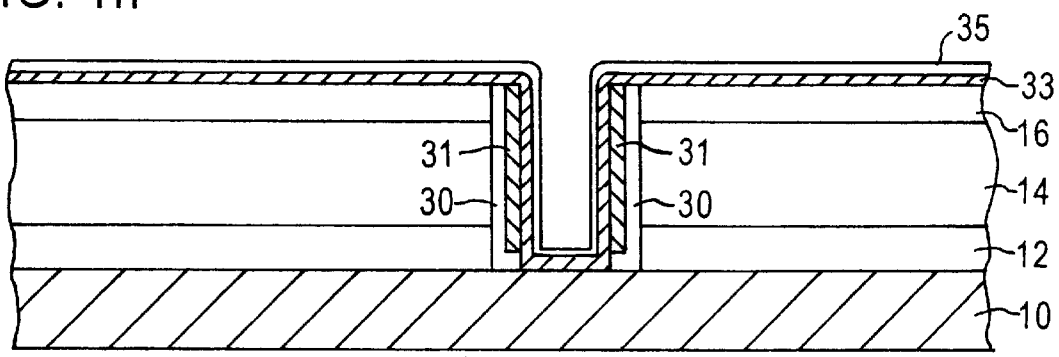

As shown in FIG. 1h, a copper seed layer 35 is deposited over the second metal layer 33, by conventional PVD processes, including ionized metal plasma (IMP), self-ionized plasma (SIP), and hollow cathode magnetron (HCM). The copper seed layer 35 is deposited without air break following the deposition of the second metal layer 33, in certain preferred embodiments of the present invention. Since Ta is very reactive with air, $Ta_2O_5$ would form on the Ta if an air break occurred. Such an oxide layer between Ta and Cu undesirably increases resistance. Deposition of the copper seed layer 35 without air break reduces the resistance. An exemplary thickness of the copper seed layer 35 is between about 400 Å and about 1500 Å.

Figure 1I:
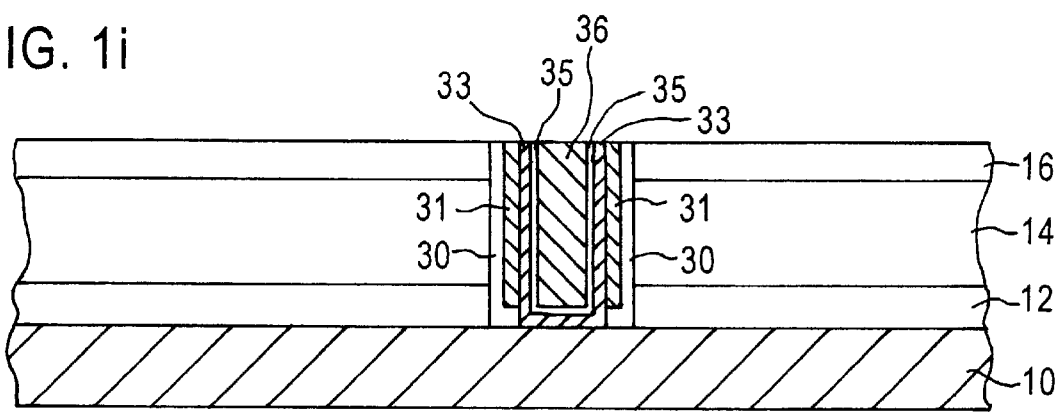

In FIG. 1i, the pattern opening 24 has been filled with a conductive material, such as copper or copper alloy, by conventional electroplating techniques on the copper seed layer 35 to form a conductive feature 36. Planarization, such as by chemical mechanical polishing (CMP), can then be performed, resulting in the structure of FIG. 1i. In this single damascene structure, the conductive feature 36 is electrically connected to the conductive material in the underlying substrate 10 through the thin layer of low resistance alpha phase tantalum in the second metal layer 31. The dielectric layer 14 of the metal interconnect structure of FIG. 1i is substantially free of copper contamination, created either during a diffusion barrier etch or subsequent reverse sputtering to clean the surface 32 of the conductive material of substrate 10. The thinness of the layer of tantalum 33 at the bottom of the opening 24 provides a very low contact resistance between the tantalum 33 and the underlying substrate 10.

In the embodiment of the invention depicted in FIGS. 2a–2i, a single damascene structure is also provided, but with a dual hard mask instead of a single cap layer/hard mask 16 as depicted in FIGS. 1a–1i. The formation of the conductive feature in FIGS. 2a–2f is similar to that of FIGS. 1a–1i, so that similar steps will not be described as fully as in the above-described embodiment.

Figure 2A:
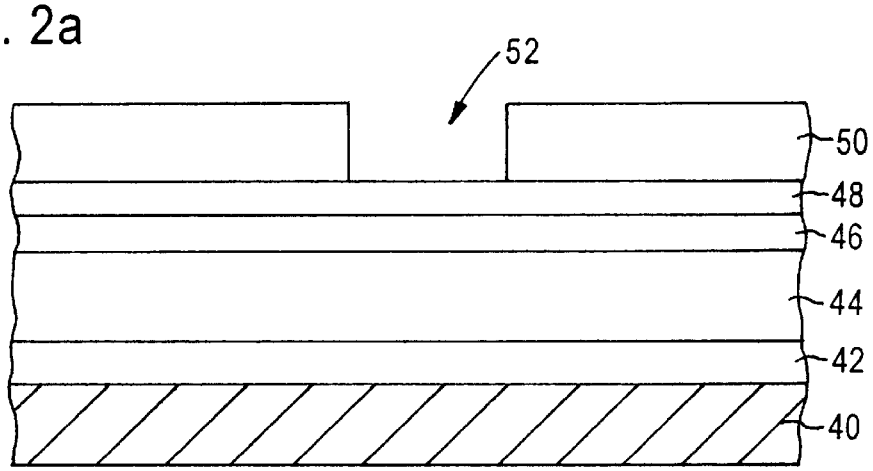
FIGS. 2a–2i depict an embodiment of the present invention for forming a metal interconnect structure in which a dual hard mask is used.

In FIG. 2A, a metal interconnect structure having a substrate 40, a diffusion barrier 42 and a dielectric layer 44 are provided, similarly to the embodiment of FIGS. 1a–1i. A cap layer 46 is provided on the dielectric layer 44. In this embodiment, however, a hard mask layer 48 is formed on the cap layer 46. The hard mask layer 48 may be made of a material such as silicon oxide (SiO₂), for example. Other suitable materials may be employed that may be etched by a chemistry that will stop on the cap layer 46. A mask layer 50 is provided on the hard mask layer 48 and patterned with a pattern opening 52.

Figure 2B:
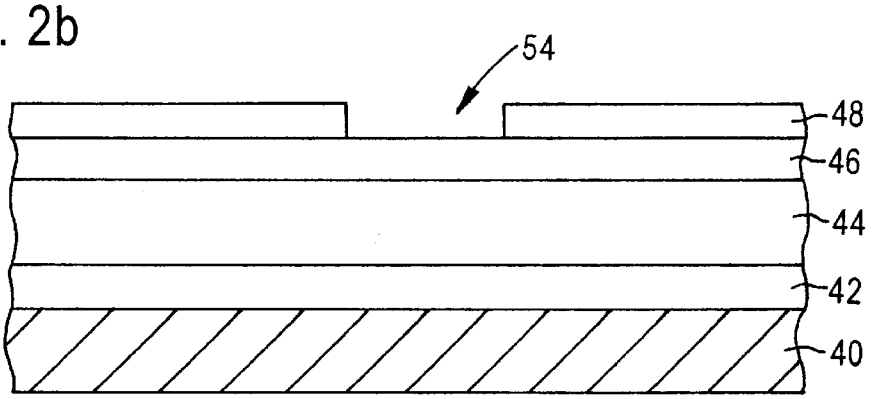

As depicted in FIG. 2*b*, an opening 54 is etched into the hard mask layer 48 by conventional techniques and the mask layer 50 is removed. Cap layer 46 acts to fully protect the underlying dielectric layer 44 from the mask removal process. This protection has increased importance when low k dielectric material is employed as the dielectric material of the dielectric layer 44, since many low k dielectric materials are sensitive to photoresist removal processes and may be damaged thereby.

Figure 2C:
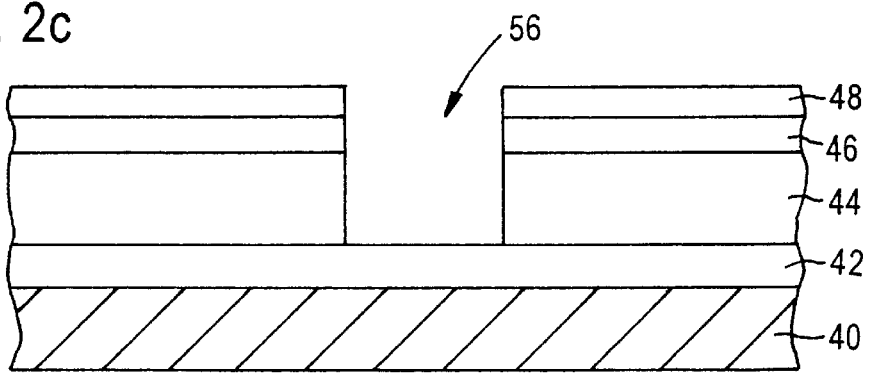

FIG. 2*c* shows the structure of FIG. 2*b* after a further anisotropic etching is performed in accordance with the pattern opening 54 to create a pattern opening 56 through the cap layer 46 into the dielectric layer 44. The etching stops at the diffusion barrier 42, using an etching chemistry and an etching process known to those with skill in the art.

Figure 2D:
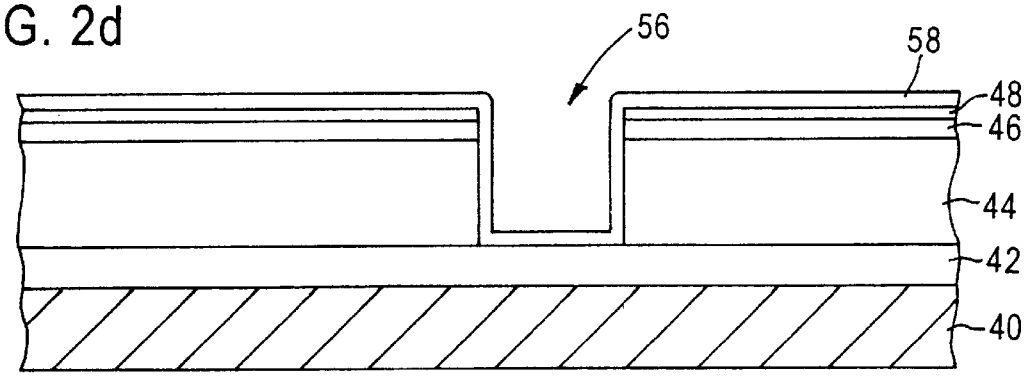

Following the etching of dielectric layer 44, a conformal layer of barrier material 58 is deposited over the hard mask layer 48 and in the pattern opening 56, as depicted in FIG. 2*d*. Sidewalls of the dielectric layer 44 are covered by the barrier material 58, as well as the bottom of the opening 56 formed by the diffusion barrier 42. Exemplary thicknesses of the barrier material are within the range of between about 25 to about 100 Ångstroms, as exemplary values. As in the earlier embodiments, described in FIGS. 1*a*–1*i*, the barrier material 58 may be made of a nitride, for example. Other suitable materials may be employed that will act as passivation layer to prevent contamination of the conductive material in to the dielectric layer 44.

Figure 2E:
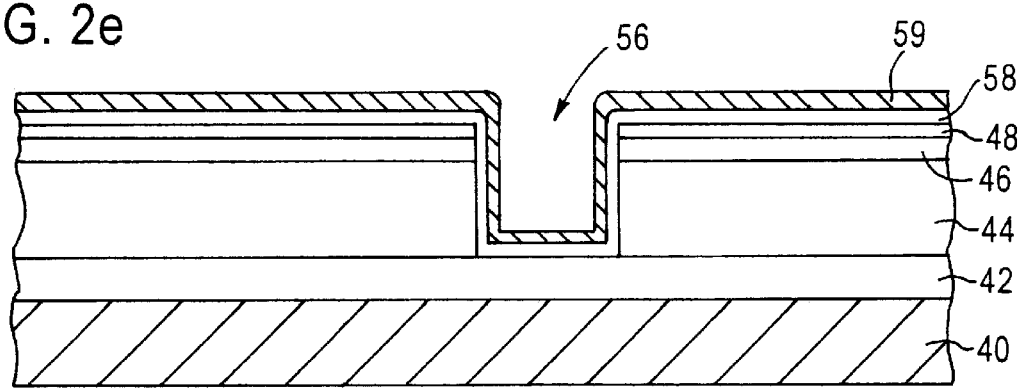

A conformal first metal layer 59 is next deposited, by PVD, for example, as shown in FIG. 2*e*. The first metal layer 59 may be made of tantalum, for example. As in the earlier described embodiment, the first metal layer 59 may be deposited without an air break after the conformal layer of barrier material 58 is deposited.

Figure 2F:
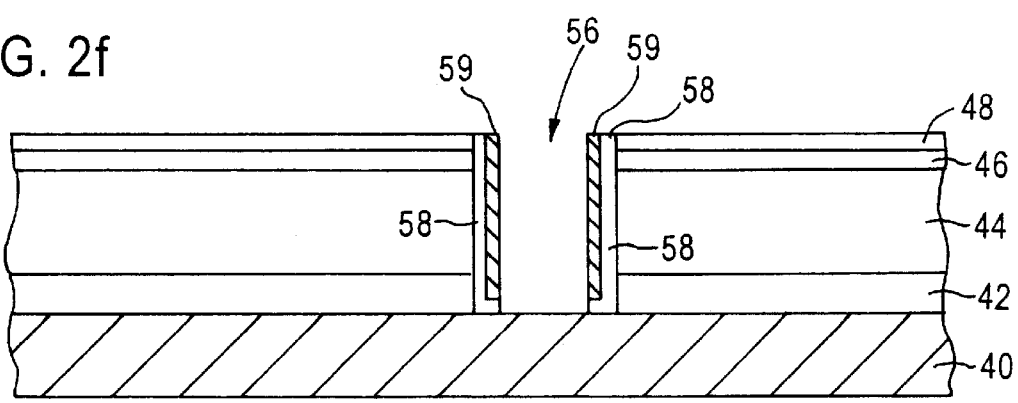

A directional etching is then performed, the results of which are depicted in FIG. 2*f*. The directional etching removes the horizontal nitride and tantalum, while leaving the vertical nitride and tantalum. Hence, the directional etching, such as by reactive ion etching, removes the diffusion barrier 42 within the pattern opening 56, as well as the nitride and tantalum overlying the diffusion barrier 42. Nitride 58 and tantalum 59 remaining on the sidewalls of the dielectric layer 44 protect the dielectric layer 44 against conductive material from the substrate 40 that is sputtered up during the diffusion barrier etch. A subsequent reverse sputtering to clean the surface of the substrate 40 may also produce contaminating conductive material particles. However, such particles will also be prevented from diffusing into the dielectric layer 44 by the barrier material 58 and the tantalum 59 on the sidewalls of the pattern opening 56.

Figure 2G:
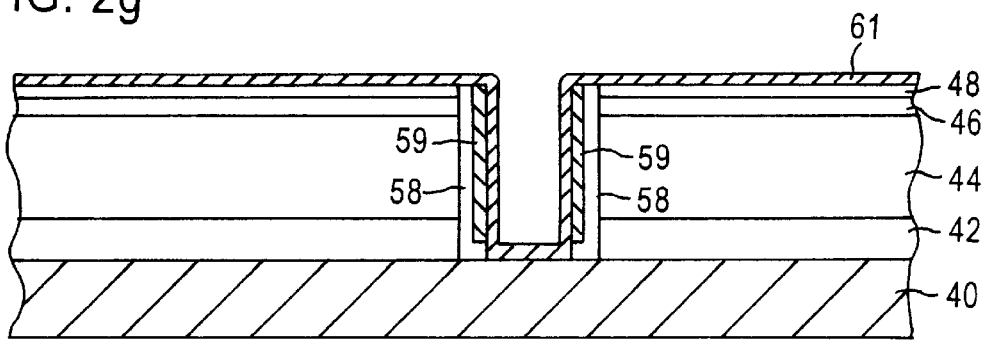
Figure 2H:
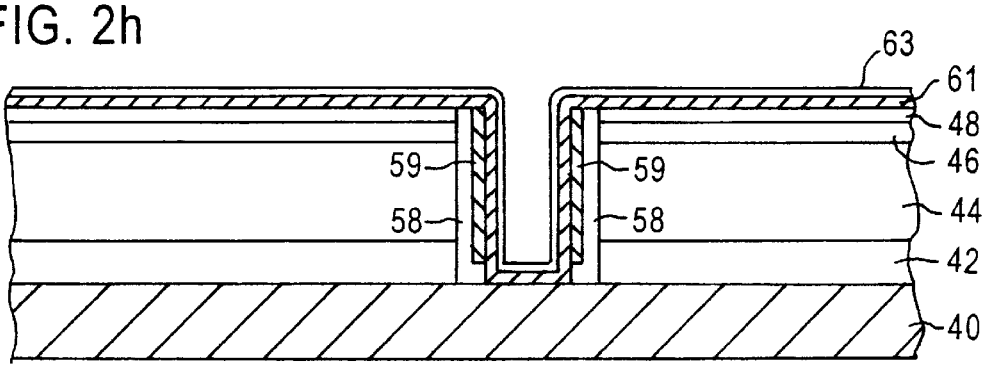

In FIG. 2*g*, a second metal layer 61 is conformally deposited, by PVD, for example. A copper seed layer 63 is then deposited without air break, as seen in FIG. 2*h*.

Figure 2I:
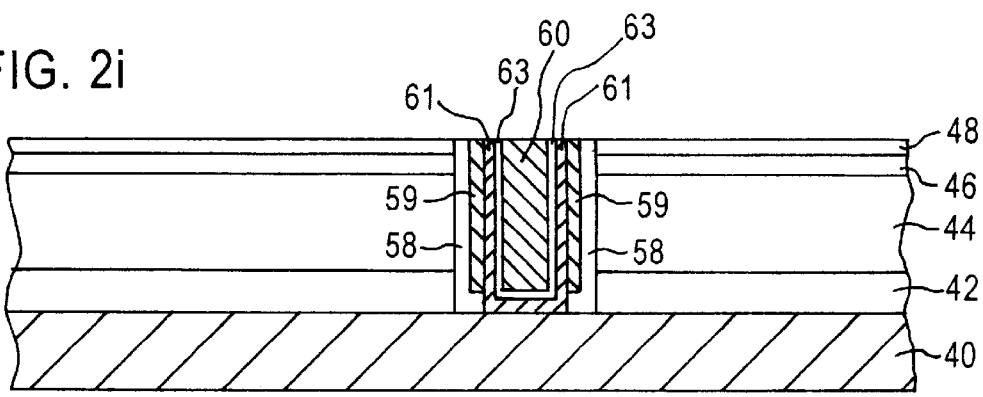

The pattern opening 56 is filled by electroplating with a conductive material, such as copper or a copper alloy, to form a conductive feature 60 that is electrically connected to the underlying conductive material in the substrate 40. After planarization, the resulting structure is shown in FIG. 2*i*.

FIGS. 3*a*–3*g* depict some of the sequential processing steps employed in a dual damascene technique that uses the conformal barrier layer and metal layers of the present invention to protect the low k dielectric layers from contamination. Only certain ones of the processing steps are depicted to illustrate the use of a conformal barrier material and metal barrier layers in a dual damascene technique. In other respects, the individual process steps are the same as in the earlier described embodiments of the invention.

Figure 3A:
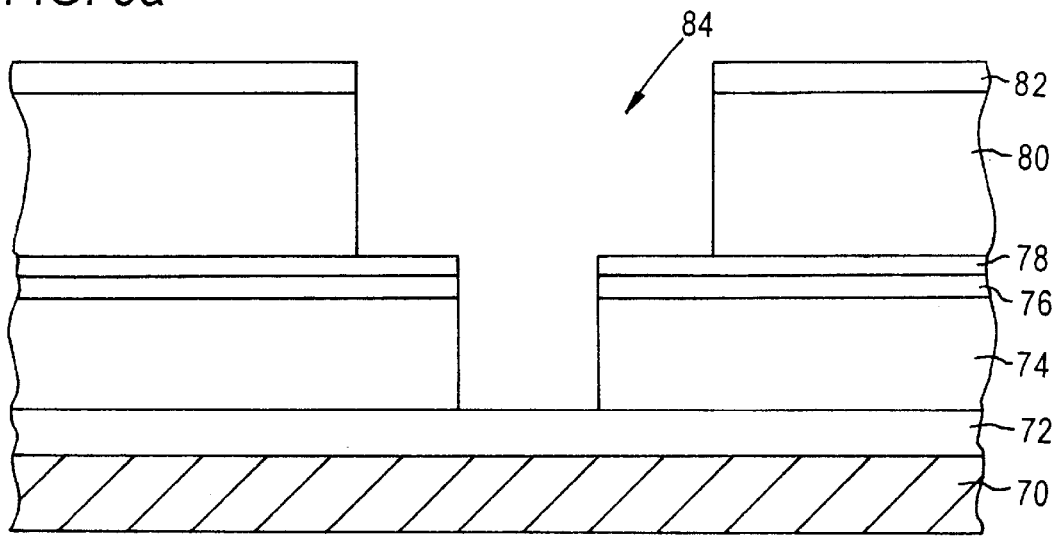

In FIG. 3*a*, a dual damascene opening 84 is formed in a metal interconnect structure that has a substrate 70 and a diffusion barrier 72. A first dielectric layer 74 overlies the diffusion barrier 72 and is capped by a capping layer 76. An etch stop layer 78, formed of silicon oxide, for example, is provided over the cap layer 76. A second dielectric layer 80, which may be a low k dielectric layer like the first dielectric layer 74, is provided on the etch stop layer 78. Cap layer 82, formed of silicon nitride or silicon oxynitride, for example, is formed on the second dielectric layer 80.

Figure 3B:
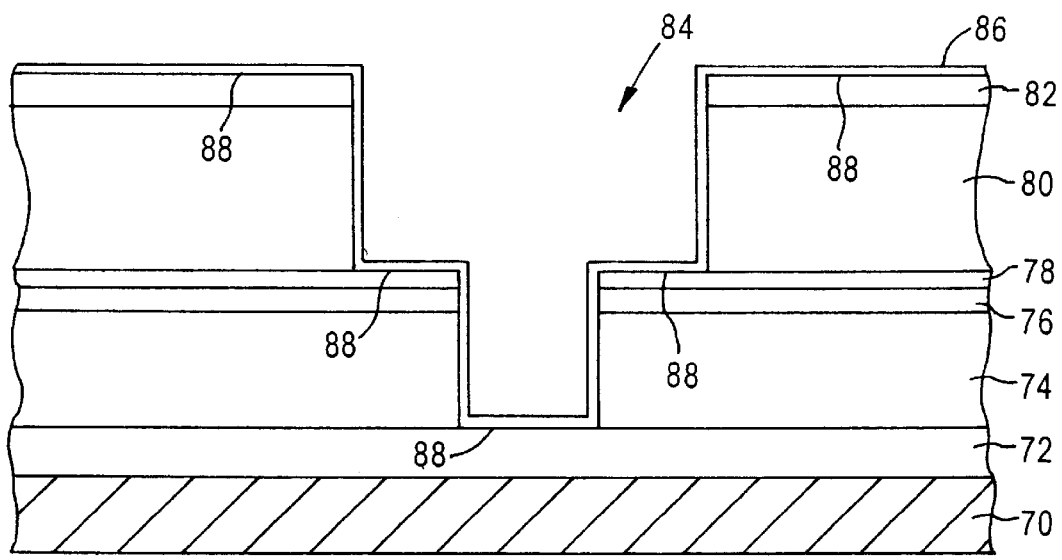

During the etching of the first and second dielectric layers 74, 80, the etching stops at the diffusion barrier 72. At this point, as depicted in FIG. 3*b*, a conformal layer 86 of barrier material is deposited over the cap layer 82 and within the pattern opening 84. A plurality of horizontal surfaces 88 are covered by the barrier material 86, which may be a nitride, for example.

In FIG. 3*c*, a first layer of metal 87 is conformally deposited over the barrier material 86. As in the earlier described embodiments, the first metal layer 87 may be made of alpha phase tantalum. The first metal layer 87 may be between about 50 Å and about 150 Å, for example. The first metal layer 87 is advantageously deposited by PVD without air break following the deposition of the barrier material 86.

In FIG. 3*d*, a directional etching has been performed to remove the barrier material 86 and the first metal layer 87 from the horizontal surfaces within the pattern opening 84 and on the cap layer 82. Barrier material 86 and the first metal layer 87 formed on the sidewalls of the first and second dielectric layers 74, 80 remain after the directional etching. Barrier material 86 and the first metal layer 87 on the sidewalls prevent the conductive material on the substrate 70 from contaminating the dielectric layer 74, 80 during the removal of the diffusion barrier 72 with the pattern opening 84, as in the earlier described embodiments.

Figure 3E:
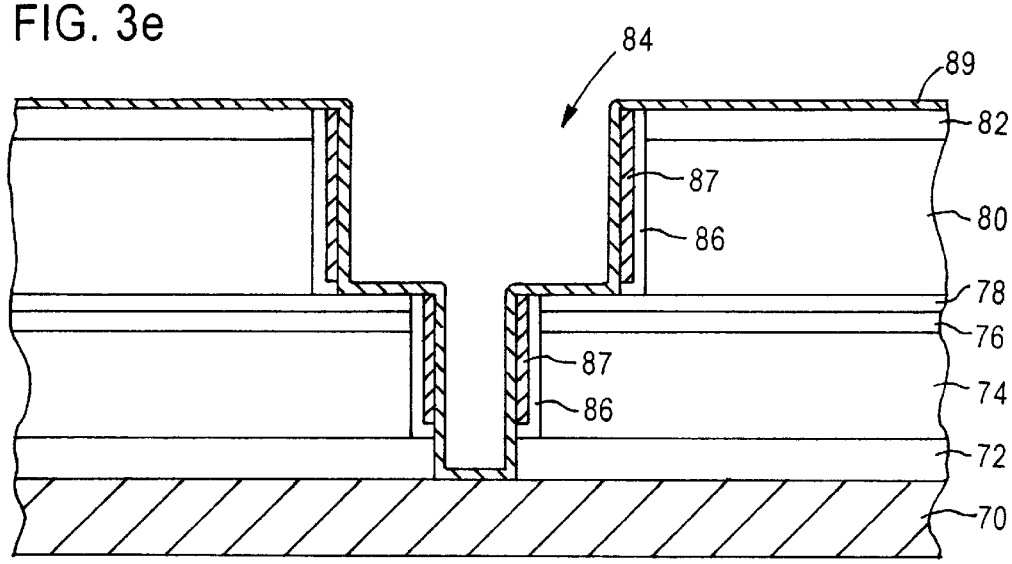

FIG. 3*e* depicts the interconnect structure after a second metal layer 89 has been conformally deposited, such as by PVD. As in the earlier described embodiments, the second metal layer 89 may be made of the same material (e.g., alpha phase tantalum) as the first metal layer 87. The thickness of the second metal layer 89 is between about 25 Å and about 100 Å in certain embodiments of the invention.

Figure 3F:
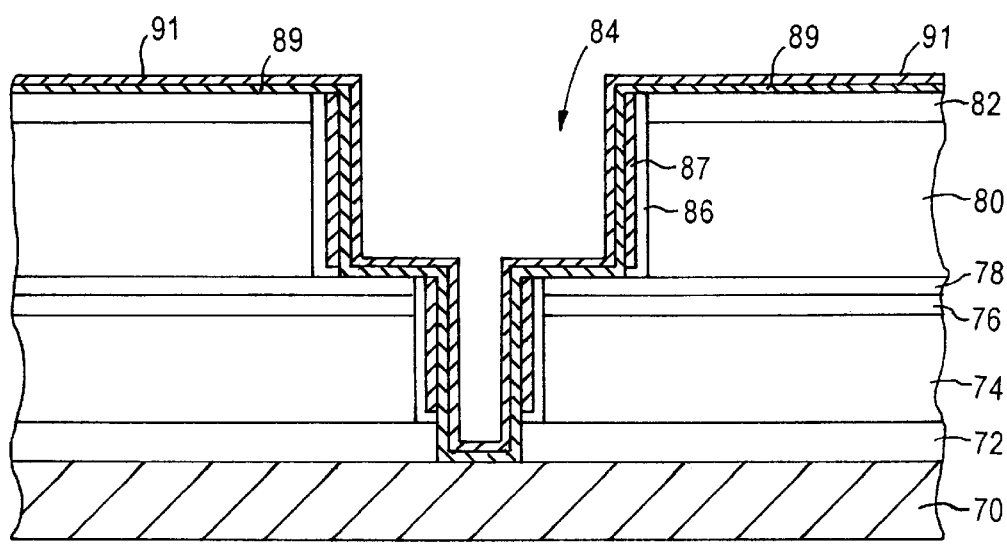
Figure 3G:
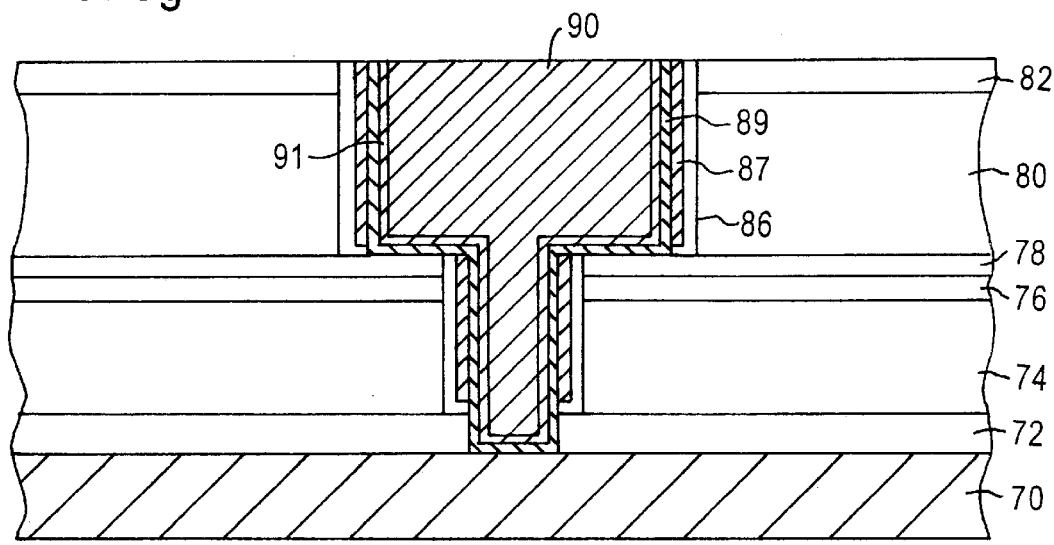
Figure 4:
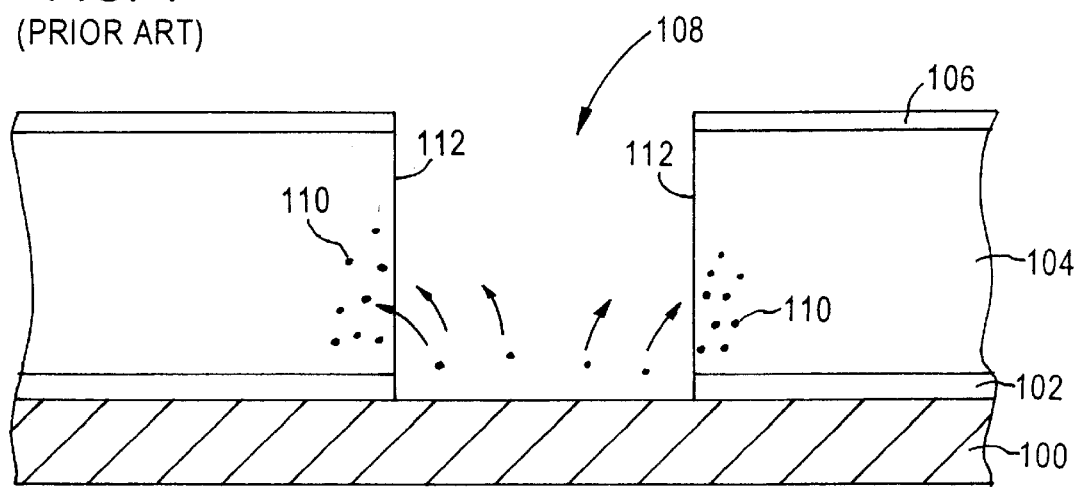
FIG. 4 is a schematic depiction of a portion of a metal interconnect structure following the removal of the diffusion barrier in accordance with prior art methodologies.

A copper seed layer 91 is then deposited by PVD, without air break, over the second metal layer 89. The resulting structure is shown in FIG. 3*f*.

A conductive line and conductive plug are then formed simultaneously by filling the pattern opening 84 with conductive material 90, such as by electroplating copper or a copper based alloy on the copper seed layer by conventional electroplating techniques. The metal interconnect structure exhibits little or no contamination of the dielectric layers 74, 80 by the conductive material in the substrate 70 since the sidewalls of the opening 84 are protected by the barrier material 86 and the first metal layer 87 during etching of the diffusion barrier. The second metal layer 89 acts as a further barrier to the copper and protects the dielectric layers 74, 80 following deposition of the copper. Hence, the first and second metal layers 87, 89 form a suitably thick metal barrier on the sidewalls of the dielectric layers 74, 80.

However, the provision of only a thin, second metal layer 89 on the bottom of the opening assures a low contact resistance between the second metal layer 89 and the conductive material of the underlying substrate 10.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of forming an interconnect structure, comprising the steps of:

etching through a dielectric layer to a diffusion barrier directly overlying conductive material to create an opening with a bottom and sidewalls;

conformally depositing a nitride barrier layer on the bottom and sidewalls of the opening;

conformally depositing a first metal layer on the nitride barrier layer;

directionally etching the nitride barrier layer and the first metal layer to remove the diffusion barrier, the nitride barrier layer and the first metal layer from the bottom of the opening to expose the underlying conductive material within the opening and maintain the nitride barrier layer and the first metal layer on the sidewalls of the opening, the nitride barrier layer and the first metal layer substantially preventing scattering and diffusion of the conductive material underlying the diffusion barrier into the dielectric layer;

conformally depositing a second metal layer in the opening and directly on the conductive material exposed within the opening;

depositing a copper seed layer over the second metal layer; and electroplating copper or a copper based alloy in the opening.

2. The method of claim 1, wherein the first and second metal layers consist of the same metal.

3. The method of claim 2, wherein the second metal layer has a thickness of between about 25 Å and about 100 Å.

4. The method of claim 3, wherein the first and second metal layers consist of tantalum (Ta).

5. The method of claim 4, further comprising preventing air exposure between the step of depositing a copper seed layer the step of conformally depositing a second metal layer.

6. The method of claim 4, wherein the opening is a single damascene opening.

7. The method of claim 4, wherein the opening is a dual damascene opening and wherein the directional etching of the barrier material and the first metal layer is oriented to remove barrier material and the first metal layer from horizontal surfaces and not remove substantial barrier material or the first metal layer from vertical surfaces within the dual damascene opening.

8. The method of claim 5, further comprising preventing air exposure between the step of conformally depositing a nitride barrier layer on the bottom and sidewalls of the opening and the step of conformally depositing a first metal layer on the nitride barrier layer.

9. A method of forming a copper interconnect, comprising the steps of:

forming an opening in a low k dielectric layer that is directly on conductive material, the opening being bounded by sidewalls of the dielectric layer and a diffusion barrier underlying the dielectric layer and forming a horizontal surface;

conformally depositing nitride and a first tantalum layer within the opening such that the diffusion barrier is covered with horizontal layers of nitride and tantalum and the sidewalls are covered with vertical layers of nitride and tantalum;

directional etching to remove the horizontal layers of nitride, tantalum and the diffusion barrier at the bottom of the opening to expose the conductive material in the opening;

conformally depositing a second layer of tantalum in the opening and directly on the conductive material;

depositing a copper seed layer on the second layer of tantalum; and electroplating copper or a copper-based alloy in the opening.

10. The method of claim 9, wherein the second layer of tantalum has a thickness of between about 25 Å and about 100 Å.

11. The method of claim 10, wherein the tantalum in the first and second layers of tantalum comprises alpha phase tantalum.

\* \* \* \* \*